United States Patent
Kim et al.

(10) Patent No.: US 10,126,436 B2
(45) Date of Patent: Nov. 13, 2018

(54) SCINTILLATOR AND METHOD FOR MANUFACTURING THE SAME

(71) Applicant: Kyungpook National University Industry-Academic Cooperation Foundation, Daegu (KR)

(72) Inventors: Hong Joo Kim, Daegu (KR); Hwanbae Park, Daejeon (KR); Sunghwan Kim, Chungcheongbuk-do (KR); Gul Rooh, Daegu (KR)

(73) Assignee: Kyungpook National University Industry-Academic Cooperation Foundation, Daegu (KR)

( * ) Notice: Subject to any disclaimer, the term of this patent is extended or adjusted under 35 U.S.C. 154(b) by 0 days.

(21) Appl. No.: 15/737,221

(22) PCT Filed: Jul. 29, 2015

(86) PCT No.: PCT/KR2015/007953
§ 371 (c)(1),
(2) Date: Dec. 15, 2017

(87) PCT Pub. No.: WO2016/204336
PCT Pub. Date: Dec. 22, 2016

(65) Prior Publication Data
US 2018/0172850 A1    Jun. 21, 2018

(30) Foreign Application Priority Data
Jun. 16, 2015 (KR) .................. 10-2015-0085447

(51) Int. Cl.
*G01T 1/20* (2006.01)
*G01T 1/202* (2006.01)
(Continued)

(52) U.S. Cl.
CPC ............ *G01T 1/2023* (2013.01); *C09K 11/62* (2013.01); *C09K 11/626* (2013.01); *C09K 11/77* (2013.01);
(Continued)

(58) Field of Classification Search
CPC . G01T 1/2023; C09K 11/626; C09K 11/7772; C09K 11/003
(Continued)

(56) References Cited

U.S. PATENT DOCUMENTS

| 3,714,057 A | 1/1973 | Hofstadter et al. |
| 7,368,719 B2 * | 5/2008 | Srivastava ............ C09K 11/772 250/361 R |
| 2013/0126741 A1 * | 5/2013 | Srivastava .......... C09K 11/7773 250/362 |

FOREIGN PATENT DOCUMENTS

| JP | 2014-534304 A | 12/2014 |
| KR | 10-2003-0003226 A | 1/2003 |

(Continued)

OTHER PUBLICATIONS

H.J. Kim et al, "Luminescence and scintillation properties of the new Ce-doped Tl2LiGdCl6 single crystals", Journal of Luminescence, Mar. 30, 2015, vol. 164, pp. 86-89.
(Continued)

*Primary Examiner* — David Porta
*Assistant Examiner* — Meenakshi Sahu
(74) *Attorney, Agent, or Firm* — Procopio, Cory, Hargreaves & Savitch LLP

(57) ABSTRACT

The present invention relates to a scintillator, a method for manufacturing the same, and an application for the same. The scintillator according to an embodiment of the present invention includes a matrix material including, as a main component, thallium, lanthanum, and a halogen element;
(Continued)

and an activator doped onto the matrix material. The scintillator according to an embodiment of the present invention has a formula $Tl_aL_ibX_c:yCe$, and in the formula: X is a halogen element; a=1, b=2, c=7, or a=2, b=1, c=5, or a=3, b=1, c=6; and y>0 and y≤0.5. The scintillator according to an embodiment of the present invention has a high efficiency of detecting radiations, a greater light yield, and an excellent fluorescence decay time characteristic.

13 Claims, 12 Drawing Sheets

(51) Int. Cl.
    *C09K 11/62*     (2006.01)
    *C09K 11/77*     (2006.01)
    *C30B 11/00*     (2006.01)
    *C30B 29/12*     (2006.01)

(52) U.S. Cl.
    CPC ........ *C09K 11/7772* (2013.01); *C30B 11/003* (2013.01); *C30B 11/006* (2013.01); *C30B 29/12* (2013.01); *G01T 1/202* (2013.01)

(58) Field of Classification Search
    USPC ..................................................... 250/361 R
    See application file for complete search history.

(56) References Cited

FOREIGN PATENT DOCUMENTS

| | | |
|---|---|---|
| KR | 10-2008-0055841 A | 6/2008 |
| KR | 10-2011-0116754 A | 10/2011 |
| WO | 2008/048720 A2 | 4/2008 |

OTHER PUBLICATIONS

H.J. Kim et al, "Tl2LiYCl6 (Ce3+): New Tl-based Elpasolite Scintillation material", SCINT 2015, Hotel Shattuck Plaza, Berkeley, Jun. 8, 2015 (Jun. 7-12, 2015).

International Search Report and Written Opinion for related PCT application No. PCT/KR2015/007953 dated Mar. 16, 2016.

International Preliminary Report on Patentability and Written Opinion for PCT/KR2015/007953 dated Dec. 19, 2017, 19 pages (Korean and Translation).

* cited by examiner

SCINTILLATOR AND METHOD FOR MANUFACTURING THE SAME

CROSS-REFERENCE TO RELATED APPLICATIONS

This application is a U.S. National Stage entry of PCT Application No. PCT/KR2015/007953, filed on Jul. 29, 2015, which claims priority under 35 U.S.C. § 119 of Korean Patent Application No. 10-2015-0085447, filed on Jun. 16, 2015, the entire contents of which are hereby incorporated by reference.

STATEMENT REGARDING PRIOR DISCLOSURES BY THE INVENTORS

The inventors of the present application authored and disclosed the subject matter of the present application on Mar. 30, 2015 (journal) and Jun. 8, 2015 (conference). The prior disclosures have been submitted in an Information Disclosure Statement in the present application as "H. J. KIM et al., "Luminescence and scintillation properties of the new Ce-doped Tl2LiGdCl6 single crystals", Journal of Luminescence, 30 Mar. 2015, vol. 164, pages 86-89." and "H. J. KIM et al., "Tl2LiYCl6 (Ce3+): New Tl-based Elpasolite Scintillation material", SCINT 2015, Hotel Shattuck Plaza, Berkeley, Jun. 8, 2015 (Jun. 7-12, 2015)."

Technical Field

The present invention disclosed herein relates to a scintillator, a method for manufacturing the same, and applications of the same.

Background Art

Scintillating phenomena refer to phenomena in which when a crystalline body is irradiated with a radiation, such as X-ray, neutron-ray, and charged particles, light is generated simultaneously with the irradiation of radiation. Information about the radiation can be obtained by measuring the scintillating light generated at this time by using a light-receiving element such as a photomultiplier tube and a photodiode. A scintillator is a radiation sensor which converts ionizing radiation, such as X-ray, γ-ray, and neutron ray, into light within the wavelength range of visible light. The radiation information acquired by using a scintillator can be obtained as a radiographic image through a series of processing processes. Scintillators are widely used for measuring and imaging radiations in the fields of medical imaging systems, such as computed tomography (CT), positron emission tomography (PET), γ-camera, single photon emission computer tomography (SPECT), various radiation detectors, nuclear power plants, and industrial radiation sensors.

In order to enhance the efficiency of detecting X-ray or γ-ray, an ideal scintillating single crystal demanded from most application fields should have a high density, a high atomic number, and a high light yield, have no residual luminescence, and have a short fluorescence decay time for a fast signal processing. In addition, not only the light-emitting wavelength of the scintillator should match up with the characteristics of a light-receiving element such as a photomultiplier tube and a photodiode, but also the scintillator should have excellent mechanical strength, radiation resistance, and a long service life. In addition, single crystals of the scintillators should be easily grown and have low prices. However, since the scintillating single crystals have respective pros and cons, it is difficult to ideally use one type of scintillators in all application fields.

Since NaI:Tl appeared in 1948 by Hofstadter, various types of scintillators have been developed so far according to the advancement of radiotherapeutics, nuclear physics, high energy physics, and the like. Following NiI:Tl, scintillators, for example, alkali halides such as CsI and scintillators, such as CsI:Tl, BGO ($Bi_4Ge_3O_{12}$), $PbWO_4$, LSO ($Lu_2SiO_5$:Ce), $LaBr_3$:Ce, and $SrI_2$:Eu, have been in research. Single crystals of the CsI- or NaI-based halide scintillators are easily grown and have great light yield, but have a drawback in that Cs, Na, and I have low atomic numbers of 55, 11, 53, respectively, and thus have relatively low efficiency of detecting X-ray and γ-ray.

High density BGO ($Bi_4Ge_3O_{12}$) was used for computed tomography (CT), $PbWO_4$ was developed for high energy physics, and LSO ($Lu_2SiO_5$:Ce) was used for positron emission tomography (PET) due to an excellent fluorescence decay time characteristic (40 ns) and detection efficiency. BGO and $PbWO_4$ have high efficiency of detecting X-ray due to relatively large atomic numbers 83, 82, and 74 of Bi, Pb, and W respectively, but have a drawback of having very low light yield (8,200 phs/MeV, BGO)(200 phs/MeV, $PbWO_4$) than those of the halide-based scintillators (65,000 phs/MeV, CsI:Tl)(38,000 Phs/MeV, NaI:Tl). Lu-based oxide scintillators have expensive raw materials, very high melting points of 2,050° C., and have crystal structures very difficult to be grown to a single crystal. In addition, there is also a drawback of having a high background due to the total 34 natural radioisotopes aside from $^{176}$Lu (half-life: $3.78 \times 10^{10}$ years, natural abundance: 2.59%) present in Lu.

$LaBr_3$:Ce is the scintillator developed in 2001 by van Loef et al, has a more excellent energy resolution than existing NaI (Tl) scintillators against cesium-137 662 KeV γ-ray, but has a drawback of having a hexagonal crystalline structure such that growing a single crystal is very difficult and a high hygroscopic property.

$SrI_2$:Eu scintillators have a merit of having a very large light yield of 80,000 to 120,000 phs/MeV, but also have a drawback of having a very large hygroscopic property and a small atomic number, thereby having a low efficiency of detecting radiation.

DISCLOSURE OF THE INVENTION

Technical Problem

The present invention provides a novel-material scintillator and methods for manufacturing and applying the same which have high efficiency of detecting radiations, a large light yield, and an excellent fluorescence decay time characteristic.

Problems to be addressed by the present invention are not limited to the problems mentioned above. Other unmentioned technical problems would be obviously understood from the description below by those skilled in the art to which the present invention pertains.

Technical Solution

Embodiments of the present invention provide scintillators each including: a matrix material comprising thallium, lanthanum, and a halogen element; and an activator doped to the matrix material.

In some embodiments, the activator may include cerium.

In other embodiments, the scintillator may have a formula $Tl_aLa_bX_c$:yCe, and in the formula: X may be a halogen element; a=1, b=2, c=7, or a=2, b=1, c=5, or a=3, b=1, c=6; and y>0 and y≤0.5.

In still other embodiments, the halogen element may include at least one among Cl, Br and I.

In even other embodiment, the matrix material may include no alkali element.

In other embodiments of the present invention, scintillators each include a matrix material doped with an activator, the matrix material including a thallium halide and a lanthanum halide.

In some embodiments, the activator may include cerium halide.

In still other embodiments of the present invention, methods for manufacturing a scintillator each include: manufacturing a matrix material comprising thallium, lanthanum, and a halogen element; and doping the matrix material with an activator.

In some embodiments, the manufacturing of the matrix material may include adding a thallium halide and a lanthanum halide in a molar ratio of 1:2, 2:1, or 3:1.

In other embodiments, the doping of the activator may include doping the matrix material with a cerium halide.

In still other embodiments, the method for manufacturing scintillators may further include growing a mixture of the matrix material and the activator into a single crystal, wherein the growing the mixture into the single crystal may include descending an ampoule in which the mixture is sealed in a Bridgman electric furnace while heating the ampoule, wherein in the growing the mixture into the single crystal: the crystal may be grown while the ampoule is lowered in the Bridgman electric furnace at a crystal growing part; a product of a lowering speed of the ampoule in the Bridgman electric furnace and a temperature gradient at the crystal growing part in the Bridgman electric furnace may be set to a range of 0.2-0.3° C./hr; and the temperature gradient at the crystal growing part may be a rate of an amount of a temperature change with respect to a positional change at a crystal growing position in the Bridgman electric furnace.

In even other embodiments, in the growing the mixture of the matrix material and the activator into the single crystal, a melting temperature of the mixture may be 450-650° C.

Advantageous Effects

According to embodiments of the present invention, a novel-material scintillator and methods for manufacturing and applying the same, which have a high efficiency of detecting radiations, a large light yield, and an excellent phosphor decay time characteristic, are provided.

The effect of the present invention is not limited to the above-mentioned effects. Those skilled in the art to which the present invention pertains could obviously understand unmentioned effects from the present specification and the accompanying drawings.

MODE FOR CARRYING OUT THE INVENTION

Figure 1:
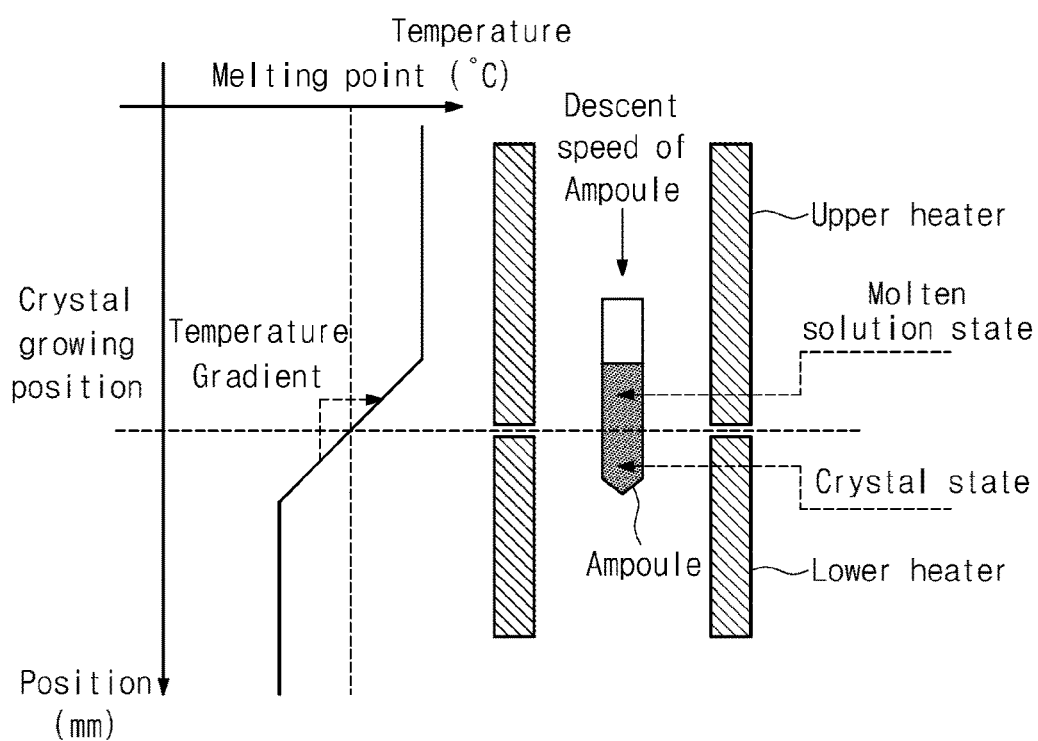
FIG. 1 shows a schematic view of a Bridgman electric furnace to describe conditions for growing a single crystal of a scintillator according to an embodiment of the present invention.

Advantages, features, and methods of accomplishing the same of the present invention will be obvious with reference to the embodiments to be described below in detail in conjunction with the accompanying drawings. However, the present invention is not limited to the embodiments set forth herein, and the present invention will only be defined by the appended claims. Even though not defined, all terms used herein (including technical or scientific terms) have the same meaning as that generally accepted by common techniques in the conventional art to which the present invention pertains. A general description of known configurations may be omitted in order not to obscure the subject matter of the present invention. The same reference numerals are used as much as possible with respect to the configuration in which the same or equivalent in the drawings of the invention.

The terms used in the present specification are merely used to describe particular embodiments, and are not intended to limit the present invention. Expression in the singular number includes a plural form unless the context clearly indicates otherwise. In this application, the terms "include", "have", "provided with", or the like is to specify that the presence of a step, an element, or combinations thereof disclosed in the specification, and it shall not be construed to preclude the presence or addition of one or more steps, elements or combinations thereof.

The present invention relates to a thallium lanthanum halide ($Tl_aLa_bX_c$:yCe) scintillator doped with an activator (such as cerium) based on thallium (Tl), lanthanum (La), and a halogen element. So far, there has been no example in which a scintillator single crystal is grown on the basis of thallium and the characteristics thereof are reported. This proves that the process of growing a scintillator single crystal on the basis of thallium is very difficult and requires high-level technology. Through research and experiments over a long period of time, the present inventors succeed in developing a novel-material scintillator, having excellent characteristics on the basis of thallium even without using an alkali element as a main component, and substantially growing the scintillator as a single crystal.

The present inventors could manufacture a novel scintillating material which has never been substantially existed through investigating a temperature condition (melting temperature) and a crystal growth condition (correlation between a descent speed of ampoule and a temperature gradient of a crystal growing part) of growing a scintillator. A scintillator according to an embodiment of the present invention is a scintillating material represented by a formula $Tl_aLa_bX_c$:yCe. In the formula $Tl_aLa_bX_c$:yCe of a scintillating material according to the present embodiment, X may be at least one element selected from the group (Cl, Br, I) consisting of halogen elements. The molar ratio a:b:c of thallium, lanthanum, and a halogen element may be 1:2:7 or 3:1:6. In addition, y is a molar ratio (concentration) of activator (Ce) ions, which are doped with impurities and generate scintillating phenomena, and may have a value of greater than 0 and greater than or equal to 50 mol % in order to obtain an appropriate amount of scintillating light.

The scintillator according to the present embodiment does not substantially include an alkali element (such as Li and Na). In this case, the meaning of including substantially no alkali element is that an alkali element is not intentionally added as a main component except for a case in which a trace of alkali element is inevitably included.

The scintillator according to an embodiment the present invention may be manufactured through a process such that a matrix material is manufactured by mixing thallium halide and lanthanum halide in a molar ratio of 1:2, 2:1, or 3:1, the matrix material is doped with an activator including a cerium halide and is grown into a single crystal. Through a lot of experiments and trials-and-errors, the present inventors could found that: when a mixture of a matrix material and an activator is grown into a single crystal, a descent speed of ampoule and a temperature gradient of a crystal growth part seriously affect a crystal growth in combination; and in order to grow the mixture of thallium-based matrix material and the activator into a single crystal, growth conditions for a crystal growing part, that is, the product of a melting temperature, a descent speed of ampoule, and a temperature gradient of the crystal growing part should be set within a specific range.

In an embodiment of the present invention, the product of the descent speed of ampoule, and the temperature gradient of the crystal growing part is favorably set within a range of 0.2-0.3° C./hr, and this is because when the product of the descent speed of ampoule, and the temperature gradient of the crystal growing part is lower than 0.2° C./hr, productivity is deteriorated, and when greater than 0.3° C./hr, crystals are broken or crystallizability is decreased, and thus, the amount of scintillating light and the fluorescence decay time characteristic deteriorate. In addition, the melting temperature of the mixture of the matrix material and the activator is favorably set within a range of 450-650° C. The melting temperature may be appropriately adjusted according to lanthanum element and halide element. While the melting temperature of conventional oxide scintillators is generally 1,000-2,000° C. or higher, the scintillator according to the present embodiment can be grown at a low melting temperature of 650° C. or lower, and thus, has a merit in that process costs may be saved.

The scintillator according to the present embodiment may be applied to various application fields for detecting radiations. Radiation detecting efficiency is determined according to a mutual action between an incident radiation and a scintillator detector. The photoelectric effect is most important for detecting efficiency in detecting X-ray, and since the photoelectric effect is proportional to the square of the atomic number of a scintillating material, the higher the atomic number of the material, the more rapidly the efficiency of detecting X-ray or γ-ray increases. Accordingly, in the present invention, a novel-material scintillator is developed on the basis of thallium having a high atomic number 81, the scintillator having a high efficiency of detecting X-ray or γ-ray.

A light yield is a value related to the size of a detecting signal generated when a scintillator detects a radiation. Since the greater the light yield, the more the signal-to-noise ratio (SNR) is improved, an excellent measuring result may be obtained with a small radiation amount. In particular, when a scintillator is used as a radiological imaging sensor, an exposed dose of the human body may be reduced. The elements determining the light yield of a scintillator are kinds and concentrations of doping impurities, crystallizability and transparency of single crystal, and the like. In the case of scintillators, crystallizability and transparency are particularly quite important factors. In general, most materials having high atomic numbers have low transparency, but in the present invention, the major component of the matrix material of the scintillator, the kind and molar ratio of the activator doped with impurities, the condition and atmosphere of crystal growth, or the like is optimized, and thus, a scintillator having a two times or more greater light yield than a commercial LYSO scintillator and transparency could be crown.

When the crystal structure of scintillating single crystal is the monoclinic system or the hexagonal system, or when the growing temperature is high, there are drawbacks in that it is quite difficult to grow an excellent quality single crystal, the single crystal is expensive and easily broken at a specific crystalline surface even though being grown. In addition, when the crystallizability or transparency is deteriorated, there may be a drawback of increasing the decay time characteristics, and since the emitted light generated due to radiation is absorbed in the scintillator, the output signal decreases. Accordingly, when growing a single crystal, it is desirable to select a crystal structure of the tetragonal system, the cubic system, or the like which are advantageous to grow a crystal. In addition, optimizing the conditions for growing a crystal is quite important. All combinations of elements are not grown into single crystals, and the process of manufacturing a single crystal having excellent scintillating characteristics is very difficult and requires high-level technology even by using a material which is grown into a single crystal.

The present inventors selected candidate elements according to ionic radii of atoms, atomic numbers, melting temperatures, phase diagrams of crystals, an X-ray diffraction (XRD) analysis, a differential thermal analysis (DSC), or the like on the basis of various trials-and-errors, experiences, and principles, and then succeeded in growing a halide scintillating single crystal which is based on Thallium and lanthanum and having an excellent scintillating characteristics through experiments using various combinations of elements, and established crystal growing conditions such as a temperature condition, an atmosphere, a crystal growth speed, or the like. As a result of X-ray diffraction (XRD) analysis, the grown scintillating single crystal is confirmed to be a novel material which is not present in the XRD database.

The fluorescence decay time characteristics of a scintillator is determined according to an energy transfer characteristic between the energy level of doping impurity functioning as a light-emitting center and the energy band level of a matrix material. Many rare earth elements are used as doping impurities functioning as the light-emitting center, and a material should be selected such that the energy level of a doping impurity and the energy level of the scintillator matrix material are well matched, and the energy transfer between the two energy levels are smoothly carried out. In particular, in the application field, such as PET, requiring a fast time characteristic, the fluorescence decay time characteristic is quite important factor. In addition, since a light-emitting wavelength is related to the energy level of doping impurity, it is required to select a material well matched to the quantum efficiency characteristic of a photomultiplier tube. In the present invention, thallium, lanthanum, and a halogen atom are selected as the main component of the matrix material, and the cerium ion is selected as a doping impurity. The cerium ion has a relatively high light yield and a fast time characteristic through 4f-5d transition, the energy level thereof is well matched to the energy level of $Tl_aLa_bX_c$ (X=Cl, Br, I) used as the matrix material.

The thallium and lanthanum-based halide scintillator of the present invention has many merits of having a high atomic number (effective atomic number $Z_{eff}$: 70.7), a two times or more greater light yield than LYSO, a high efficiency of detecting particularly X-ray or γ-ray, an excellent fluorescence decay time characteristic of 25 ns, being easily grown into a single crystal, allowing for reduced exposure dose to a human body, and the like. Thus, the scintillator of the present embodiment may not only be used as a novel-material scintillator for radiological imaging, but also be used as a radiation sensor for various industries. In particular, since the scintillator of the present embodiment has a short fluorescence decay time, the scintillator may be applied to the fields, such as positron emitting tomography imaging apparatus, requiring a fast decay time characteristics.

A method for manufacturing a scintillator according to the present embodiment may include: a step of sealing, in a quartz ampoule in a vacuum state, a mixture of a matrix material containing thallium and a halogen element, and then growing, in a Bridgman electric furnace, the sealed ampoule into a single crystal. In this case, one end of the quartz ampoule filled with a sample may be sharply processed so that a seed crystal of a single crystal to be grown in the Bridgman electric furnace is easily generated. When a single crystal is grown through a Bridgman method, the temperature and the temperature gradient at the single crystal growing position are very important, and the temperature at the single crystal growing position has a very close relation to the melting temperature of the sample. The present inventors confirmed through an experiment that setting, to 0.2-0.3° C./hr, the product of the descent speed of the ampoule and the temperature gradient of a crystal growing part is effective to grow a single crystal of a thallium-based scintillator, the single crystal having an excellent characteristic.

FIG. 1 shows a schematic view of a Bridgman electric furnace to describe conditions for growing a single crystal of a scintillator according to an embodiment of the present invention. Referring to FIG. 1, an upper heater is disposed over a lower heater, and heats an ampoule to a first temperature higher than a melting temperature (melting point) (for example, 450-650° C.) determined according to a scintillating material. The lower heater is disposed under the upper heater and heats the ampoule to a second temperature lower than the melting temperature of the scintillating material.

The heating temperatures of the upper and lower heaters may be set so that the temperature at the crystal growing position reaches the melting point of the scintillator material the product of the descent speed of the ampoule and the temperature gradient of the crystal growing part is 0.2-0.3° C./hr. In this case, the crystal growing position of the scintillator may be formed at a position between the upper and lower heaters. In the embodiment of the present invention, the temperature gradient of the crystal growing part may mean the value measured rate (change rate) of the amount of change in temperature with respect to the positional change at the crystal growing position.

In an aspect of productivity, the descent speed of ampoule is favorably set to 0.1 mm/hr or greater. In this case, although different according to the descent speed of ampoule, the temperature gradient of the crystal growing part may be set to a range of 30° C./cm or less so that the product of the lowering speed of the ampoule and the temperature gradient of the crystal growing part is 0.2-0.3° C./hr. In an embodiment of the present invention, the melting temperature may be 450-650° C. This is a much lower temperature than the melting temperature for growing conventionally used scintillators, and according to an embodiment of the present invention, a single crystal may be grown at a low temperature of 450-650° C., and thus, unit cost may be greatly reduced when manufacturing scintillators.

Example 1

A matrix material of a thallium halide (TlCl) and a lanthanum halide ($LaCl_3$) was doped with cerium and thereby manufactured a thallium lanthanum halide ($Tl_2LaCl_5$:yCe) scintillating single crystal. In order to manufacture lanthanum halide scintillator, the thallium halide and an alkali halide were mixed with a molar ratio of 1:1, 1:2, or 3:1, an appropriate amount of cerium chloride was then added, and then the resultant was sealed in a quartz ampoule at a vacuum of approximately $10^{-5}$ torr. The molar ratio of cerium chloride ($CeCl_3$) were changed into 0 mol %, 0.5 mol %, 1 mol %, and 10 mol % with respect to the number of moles of the lanthanum element. The sealed quartz ampoule was grown into a thallium lanthanum halide ($Tl_2LaCl_5$:yCe) scintillator in the Bridgman electric furnace. In this case, the descent speed of ampoule and the crystal growing condition of the crystal growing part were set to 0.2-0.3° C./hr.

When a single crystal is grown through the Bridgman method, the temperature and the temperature gradient at the single crystal growing position and the descent speed of sample are very important. The temperature at the single crystal growing position has a close relationship with the melting temperature of the sample. The melting temperature of $Tl_2LaCl_5$:yCe is 530° C., and thus, a single crystal is grown at a lower temperature than generally used scintillators, and the unit cost may thereby be greatly reduced when manufacturing a scintillator. The quartz ampoule filled with the sample was processed to have one sharp end so that a seed crystal of the single crystal to be grown could be easily generated. In order to investigate the scintillating characteristics of the grown single crystal, the resultant was cut into a certain size and was grinded on a polishing cloth (Buehler) by using aluminum oxide ($Al_2O_3$, 0.02) powder.

A relative light out put and fluorescence decay time at room temperature was measured by using a pulse height analysis system using an RbCs photomultiplier tube (Electron tube Ltd. D726Uk). The signal output from the photomultiplier tube was amplified by using self-made amplifiers (×10, ×100), via a 400 MHz flash analog-to-digital converter (FAD), and was then analyzed by using a ROOT program, and a field programmable gate array (FPGA) chip was used for a trigger.

Figure 2:
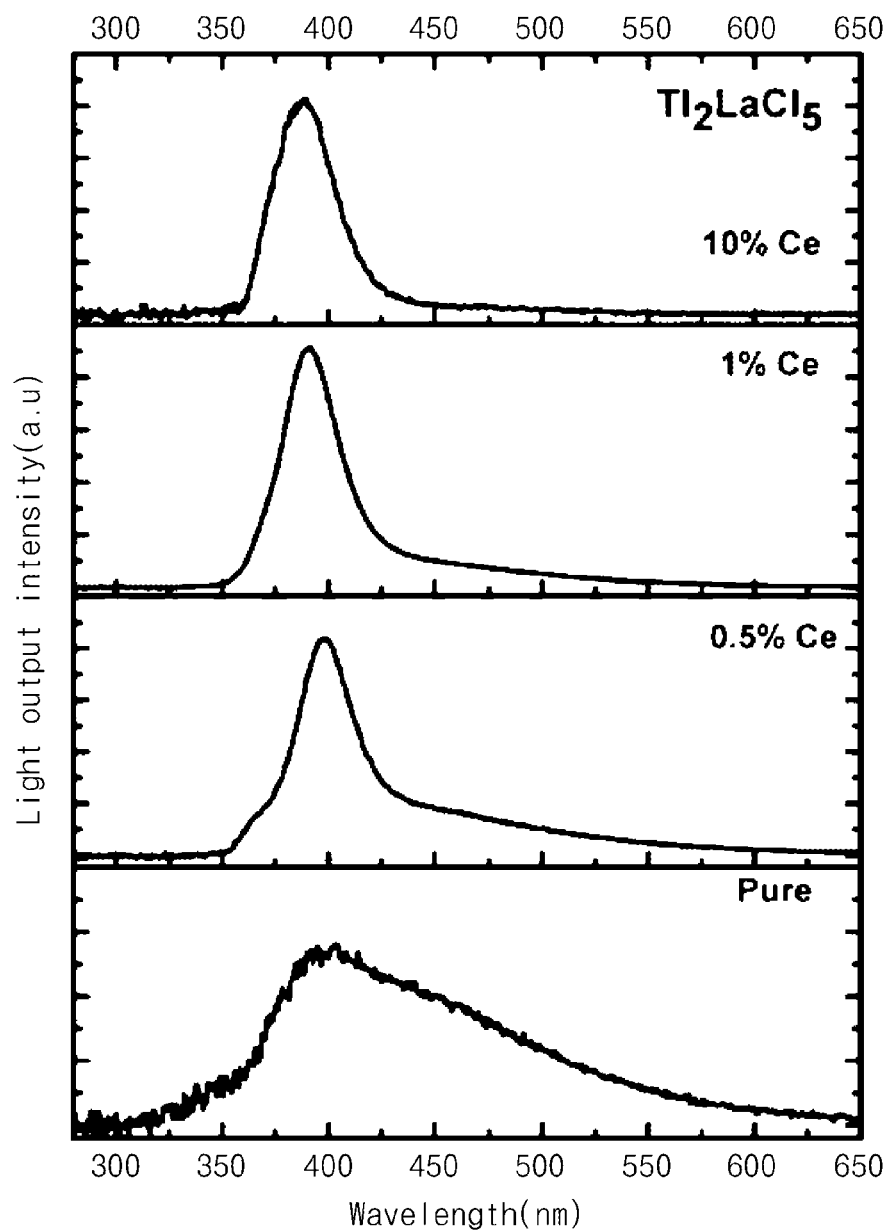
FIG. 2 is a graph of a light-emitting spectrum of a $Tl_2L_aCl_5$:yCe scintillator according to an embodiment of the present invention, the spectrum being measured in a range of 300-650 nm by using a spectroscopy.

FIG. 2 is a graph of a light-emitting spectrum of a Tl$_2$LaCl$_5$:yCe scintillator according to an embodiment of the present invention, the spectrum being measured in a range of 300-650 nm by using a spectroscopy. The concentration of cerium ions added as activators was changed in a range of 0-10 mol %. When the cerium concentration is 10 mol %, the greatest light yield occurred. Regardless of the concentration of the activator, with respect to X-ray, the light-emitting wavelength range of the scintillator is 350-450 nm and the peak wavelength is 375 nm, which well correspond to the quantum efficiency characteristics of commercial photomultiplier tubes.

Figure 3A:
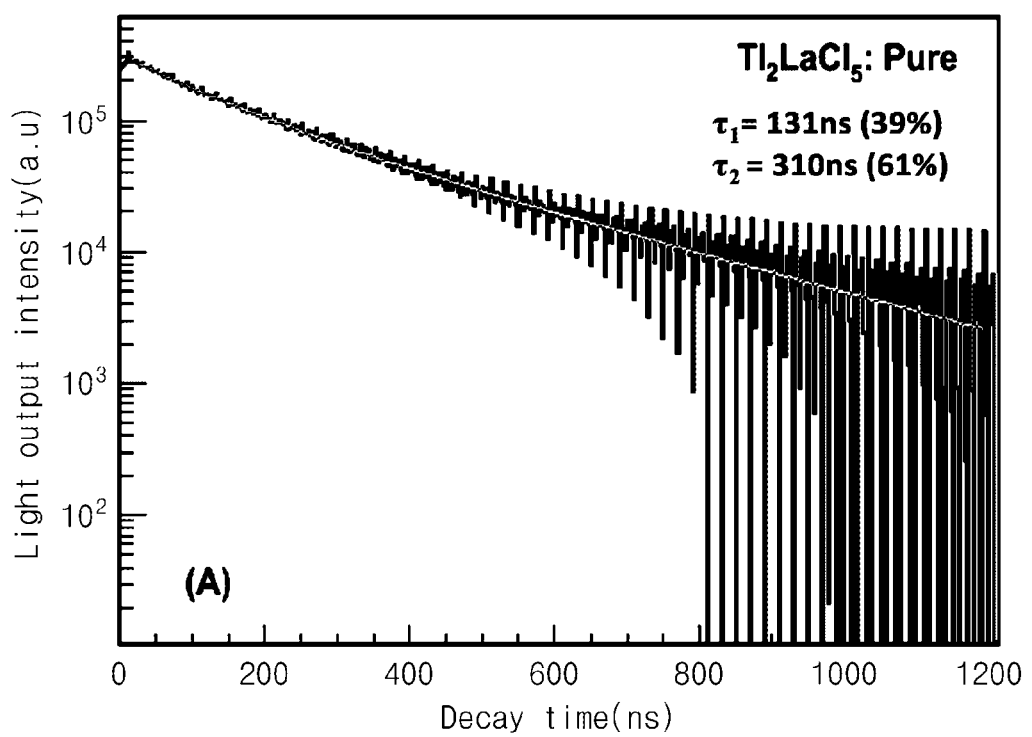
FIGS. 3A to 3C are graphs for evaluating a fluorescence decay time characteristic with respect to $^{137}$Cs 662 KeV γ-ray of a $Tl_2L_aCl_5$:yCe scintillator according to an embodiment of the present invention.
Figure 3B:
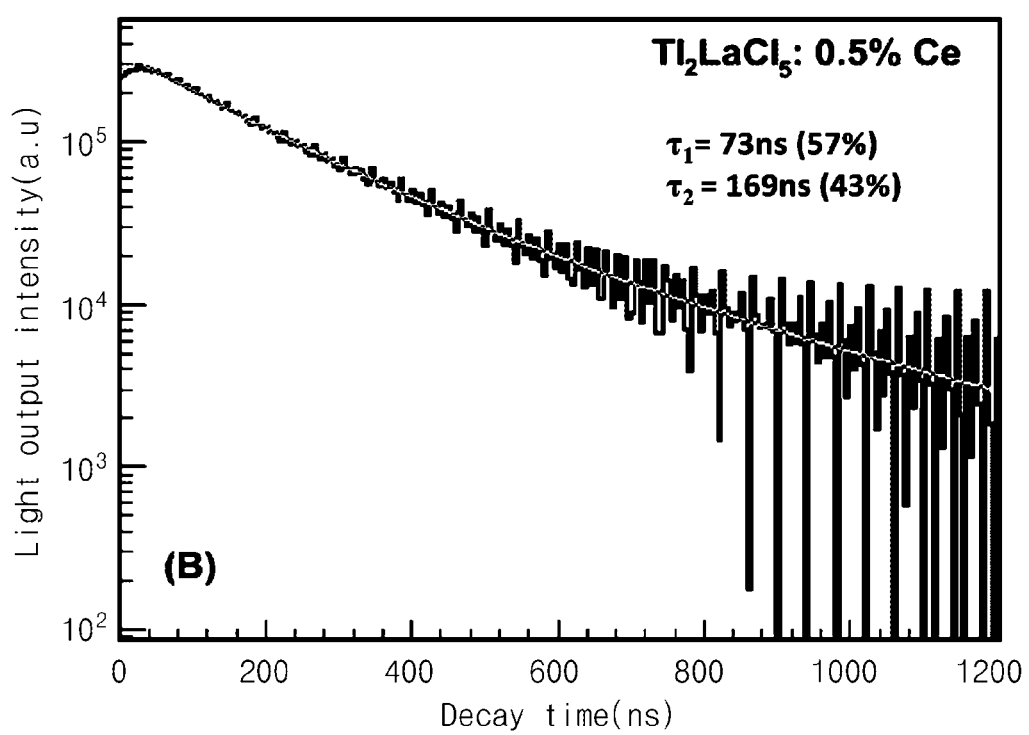
Figure 3C:
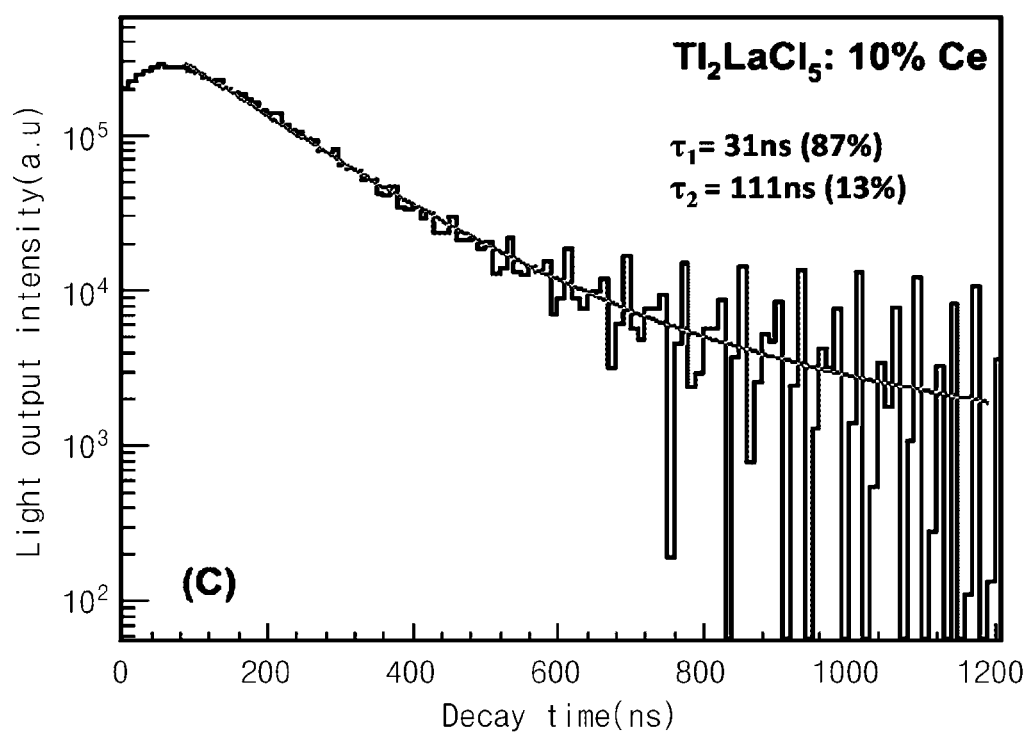

FIGS. 3A to 3C are graphs for evaluating a fluorescence decay time characteristic with respect to $^{137}$Cs 662 KeV γ-ray of a Tl$_2$LaCl$_5$:yCe scintillator according to an embodiment of the present invention. Referring to FIGS. 3A to 3C, the fluorescence decay time of the Tl$_2$LaCl$_5$:yCe scintillator is configured from two time components. Referring to FIG. 3C, in the fluorescence decay time of the Tl$_2$LaCl$_5$:yCe scintillator, the fast time component was 31 ns and occupied most (approximately 87%) of the total fluorescence, and the slow time component was 111 ns and occupied approximately 13% of the total fluorescence. In particular, the scintillation sensor for positron emission tomography imaging apparatus (PET) should simultaneously measure two γ-rays generated by pair annihilation of positron, and therefore, a fast time characteristic is very important. The present invention is determined to be very appropriate for the positron emission tomography imaging.

Figure 4:
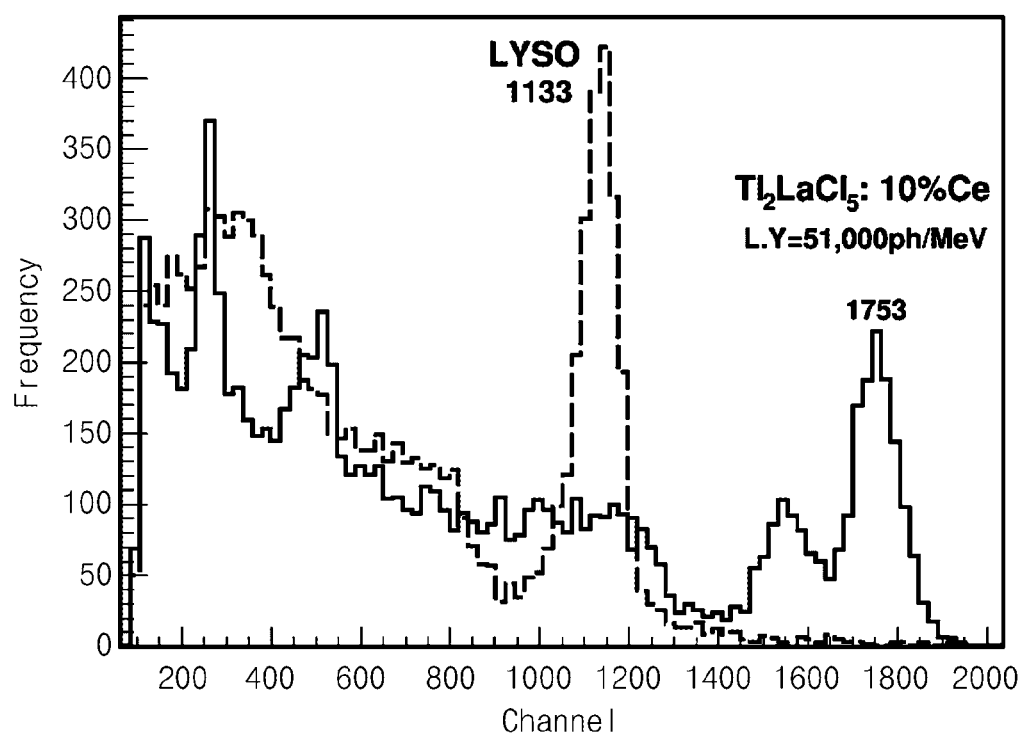
FIG. 4 is a graph of measured wave-height spectrum with respect to $^{137}$Cs 662 KeV γ-ray of a $Tl_2LaCl_5$:$Ce_{0.1}$ scintillator according to an embodiment of the present invention.

FIG. 4 is a graph of measured wave-height spectrum with respect to $^{137}$Cs 662 KeV γ-ray of a Tl$_2$LaCl$_5$:Ce0.1 scintillator according to an embodiment of the present invention. A peak in the spectrum is the peak due to photoelectric absorption, the higher the light yield, the higher channel on the wave-height spectrum shows a photoelectric peak. Since the light-emitting wavelength of a LYSO (Lu2$_{(1-x)}$Y$_{2x}$SiO$_5$:Ce) scintillator is similar to the light-emitting wavelength of the present invention, the magnitudes of the light yield may indirectly be compared with each other by using the photoelectric peak positions of the wave-height spectrums regardless of the positron efficiency of the photomultiplier tube. The total light yield of the Tl$_2$LaCl$_5$:yCe scintillator was approximately 51,000 phs/MeV and was approximately 2.1 times greater than the light yield (24,000 phs/MeV) of a commercial LYSO scintillator.

Figure 5:
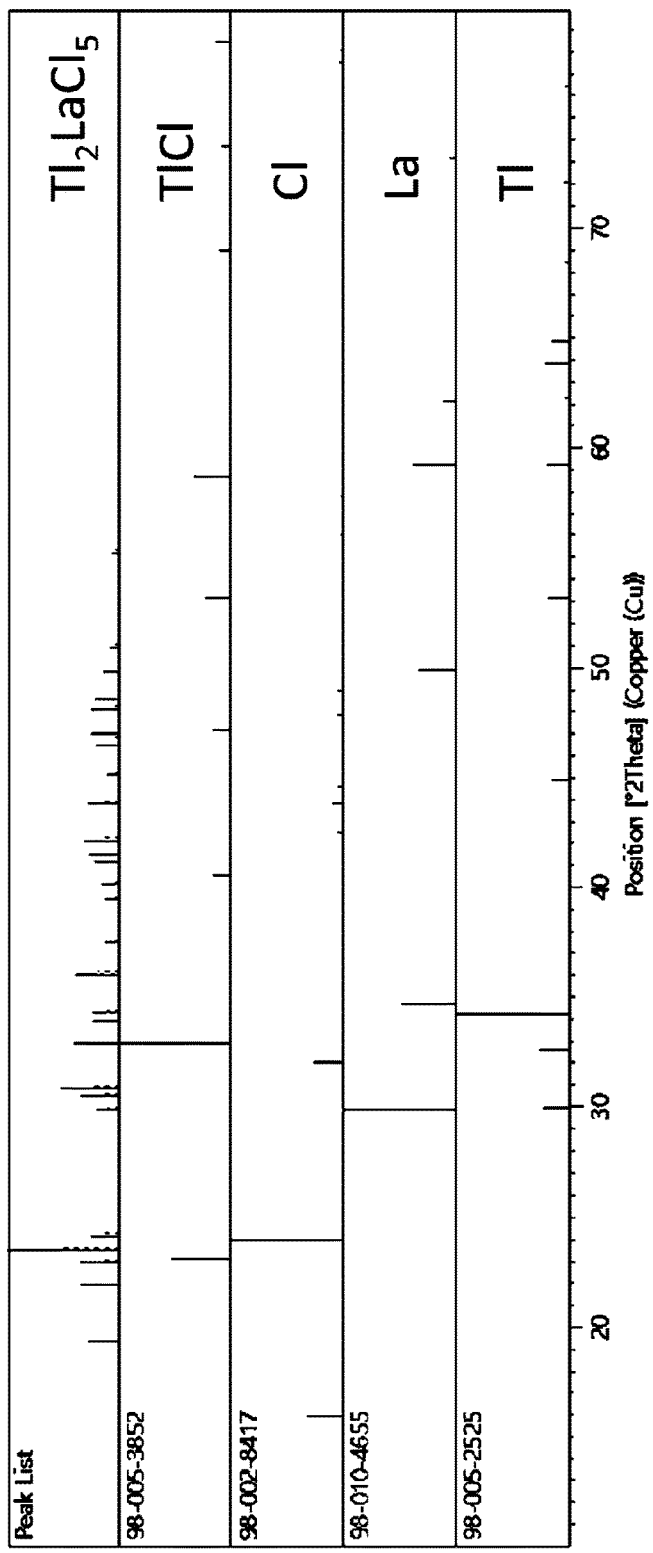
FIG. 5 is a result of an X-ray diffraction analysis of a $Tl_2LaCl_5$ scintillator according to an embodiment of the present invention.

FIG. 5 is a result of an X-ray diffraction analysis of a Tl$_2$LaCl$_5$ scintillator according to an embodiment of the present invention. An X-ray diffraction inspection is an inspection method in which the information about X-ray diffracted in a crystal or a powder-shaped material is analyzed, and thus, the constituent components, the crystal structure of the material, or the like can be analyzed. By using the X-ray diffraction inspection, it was confirmed that the thallium lanthanum halide scintillator according to an embodiment of the present invention be a material having a novel crystal structure which is not present in an existing crystal database.

The positron emission tomography imaging apparatus (PET) should have great detection efficiency and light yield to reduce the exposure dose of a patient and should simultaneously measure two γ-rays generated due to pair annihilation of positrons, and therefore, should have a fast fluorescence decay time characteristic. The scintillator according to the present embodiment showed a 2.1 times greater light yield than a commercial LYSO, and a very fast characteristic of fluorescence decay time of 25 ns when the concentration of Ce ions is 10 mol %. In light of the above-mentioned characteristics, it is determined that the scintillator according to an embodiment of the present invention is very advantageous for a positron emission tomography imaging apparatus. Table 1 below compares main scintillating characteristics of major scintillators commercially used in the present positron emission tomography imaging apparatus (PET) and Tl$_2$LaCl$_5$:10% Ce which is an example of the present invention.

TABLE 1

| Division | Tl$_2$LaCl$_5$:Ce | LSO | LYSO | GSO | BGO |
| --- | --- | --- | --- | --- | --- |
| Light yield (phs/MeV) | 51,000 | 25,000 | 24,000 | 8,000 | 8,200 |
| Energy resolution with respect to $^{137}$Cs 662 keV γ-ray | 6.9% | 10% | 9.3% | 9.2% | 10.8% |
| Effective atomic number | 70.7 | 66 | 66 | 59 | 74 |
| Density (g/cm$^3$) | 4.6 | 7.4 | 7.3 | 6.7 | 7.1 |
| Main fluorescence decay time (ns) | 25 | 40 | 50 | 60 | 300 |
| Crystal growth temperature (□) | 530 | 2,050 | 2,047 | 1,900 | 1,050 |
| Background radiation | No | Yes | Yes | No | No |
| Price | Low | High | High | Medium | Medium |

Lu-based scintillators (LSO, Lu$_2$SiO$_5$:Ce)(LYSO, Lu2$_{(1-x)}$Y$_{2x}$SiO$_5$:Ce) have merits of having high densities and effective atomic numbers and fast fluorescence decay time, but have drawbacks of having a very high crystal growing temperature such that growing a single crystal is difficult, a poor energy resolution characteristic, and presence of a background radiation due to a natural radioactive isotope. GSO (Gd$_2$SiO$_5$:Ce) has drawbacks of having a low light yield, a poor energy resolution characteristic, and a high crystal growing temperature. BGO (Bi$_{12}$GeO$_{20}$) has drawbacks of having a low light yield, a long fluorescence decay time, and a poor energy resolution characteristic.

The scintillator according to the present embodiment has merits of having a relatively greater light yield than the presently used positron emission tomography imaging, a fast fluorescence decay time characteristic, and particularly, has merits in that a scintillator single crystal can be made at a low cost at a low temperature of 600° C. or lower, and there is no background radiation. Table 2 below compares the scintillating characteristics of Tl$_2$LaCl$_5$:Ce$_{0.1}$ scintillator according to an embodiment of the present invention and a potassium lanthanum-based scintillator (K$_2$LaBr$_5$:Ce).

TABLE 2

| Division | Examples of the present invention (Tl$_2$LaCl$_5$:Ce) | Comparative example (K$_2$LaBr$_5$:Ce) |
|---|---|---|
| Light yield (phs/MeV) | 51,000 | 40,000 |
| Energy resolution with respect to $^{137}$Cs 662 keV γ-ray | 6.9% | 7.5% |
| Effective atomic number | 70.7 | 41.2 |
| Density (g/cm$^3$) | 4.6 | 3.9 |
| Main fluoresecence decay time (ns) | 25 | 50 |
| Background radiation | No | Yes |

Due to a difference in factors, such as energy band levels of matrices and activators and ionic radii of elements, compared to the potassium lanthanum-based scintillator (K$_2$LaBr$_5$:Ce), the Tl$_2$LaCl$_5$:Ce0.1 scintillator according to the embodiment of the present invention has, as shown in Table 2, merits of having a relatively greater light yield, a more excellent energy resolution characteristic, a greater effective atomic number and density, and a faster fluorescence decay time characteristic, and has merits in that there is no background radiation The scintillator according to the present embodiment has a high effective atomic number which is one of the most important characteristics for efficiently detecting X-ray and γ-ray, and thus, has a great usability in a field such as PET.

Example 2

A matrix material of a thallium halide (TlCl) and a lanthanum halide (LaCl$_3$) was doped with cerium and thereby manufactured a thallium lanthanum halide (Tl$_2$LaBr$_5$:yCe) scintillating single crystal. In order to manufacture lanthanum halide scintillator, the thallium halide and an alkali halide were mixed with a molar ratio of 1:1, 1:2, or 3:1, an appropriate amount of cerium bromide (CeBr$_3$) was then added, and then the resultant was sealed in a quartz ampoule at a vacuum of approximately 10$^{-5}$ torr. The molar ratio of cerium bromide were changed into 0 mol %, 0.5 mol %, 1 mol %, and 10 mol % with respect to the number of moles of the lanthanum element. The sealed quartz ampoule was grown into a thallium lanthanum halide (Tl$_2$LaBr$_5$:yCe) scintillator in the Bridgman electric furnace. In this case, a product of descent speed of the ampoule and temperature gradient of crystal growth was set to 0.2-0.3° C./hr.

When a single crystal is grown by using the Bridgman method, the temperature and the temperature gradient at the single crystal growing position and a descent speed of sample are very important. The temperature at the single crystal growing position has a close relationship with the melting temperature of the sample. The melting temperature of Tl$_2$LaBr$_5$:yCe is 580° C., and thus, a single crystal is grown at a lower temperature than generally used scintillators, and the unit cost may thereby be greatly reduced when manufacturing a scintillator. The quartz ampoule filled with the sample was processed to have one sharp end so that a seed crystal of the single crystal to be grown may be easily generated. In order to investigate the scintillating characteristics of the grown single crystal, the resultant was cut into a certain size and was grinded on a polishing cloth (Buehler) by using aluminum oxide (Al$_2$O$_3$, 0.02) powder.

A relative light out put and fluorescence decay time at room temperature was measured by using a pulse height analysis system using an RbCs photomultiplier tube (Electron tube Ltd. D726Uk). The signal output from the photomultiplier tube was amplified by using self-made amplifiers (×10, ×100), via a 400 MHz flash analog-to-digital converter (FAD), and was then analyzed by using a ROOT program, and a field programmable gate array (FPGA) chip was used for a trigger.

Figure 6:
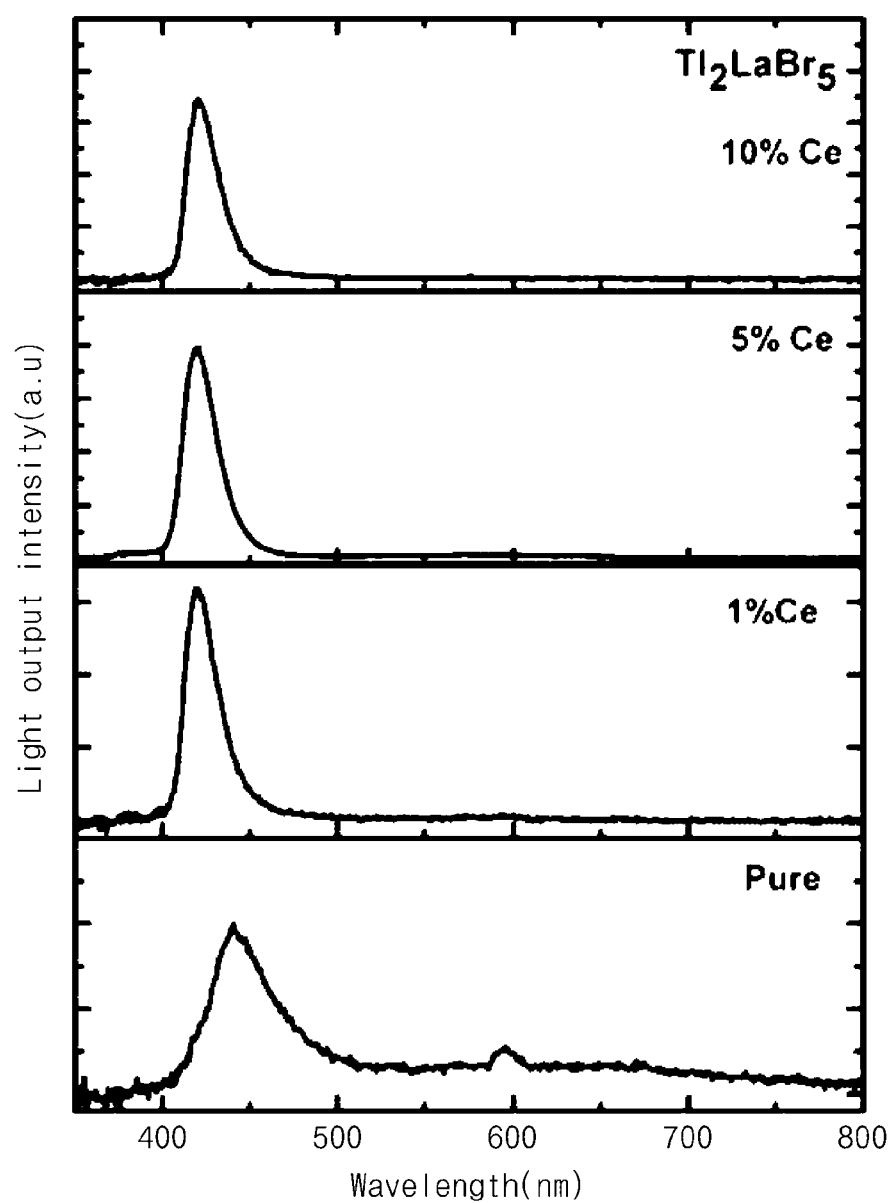
FIG. 6 is a graph of a light-emitting spectrum of a scintillator according to an embodiment of the present invention, the spectrum being measured in a range of 300-800 nm by using a spectroscopy.

FIG. 6 is a graph of a light-emitting spectrum of a Tl$_2$LaBr$_5$:yCe scintillator according to an embodiment of the present invention, the spectrum being measured in a range of 300-800 nm by using a spectroscopy. The concentration of cerium ions added as activators was changed in a range of 0-10 mol %. When the cerium concentration is 5 mol %, the greatest light yield occurred. Regardless of the concentration of the activator, with respect to X-ray, the light-emitting wavelength range of the scintillator is 400-450 nm and the peak wavelength is 418 nm, which well correspond to the quantum efficiency characteristics of commercial photomultiplier tubes.

Figure 7A:
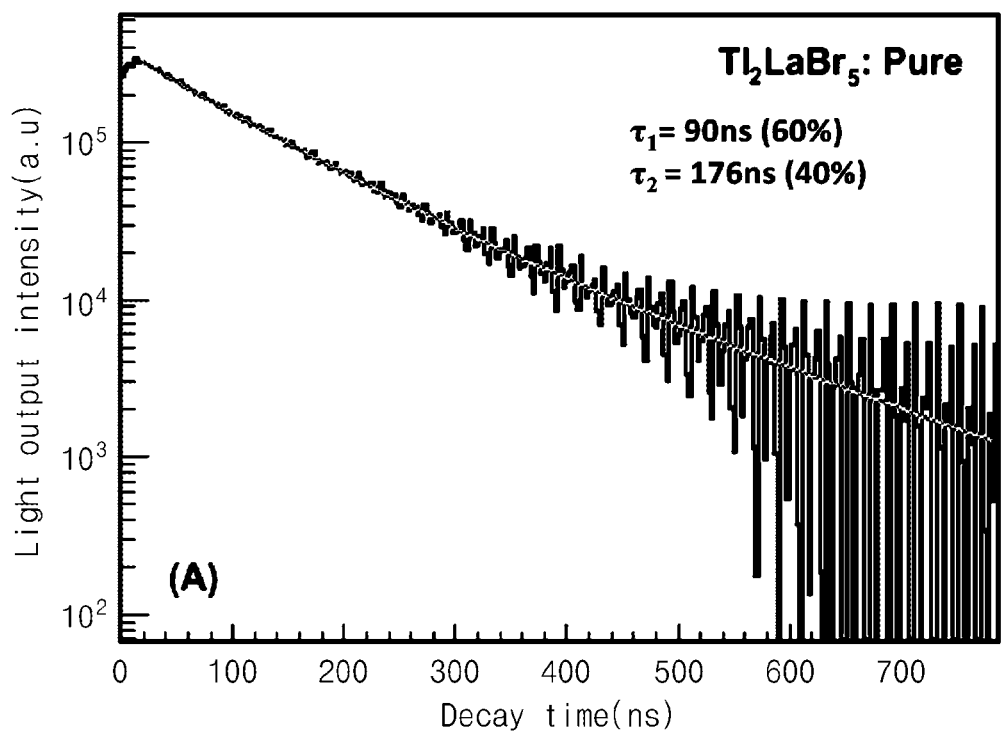
FIGS. 7A to 7C are graphs for evaluating a fluorescence decay time characteristic with respect to $^{137}$Cs 662 KeV γ-ray of a scintillator according to an embodiment of the present invention.
Figure 7B:
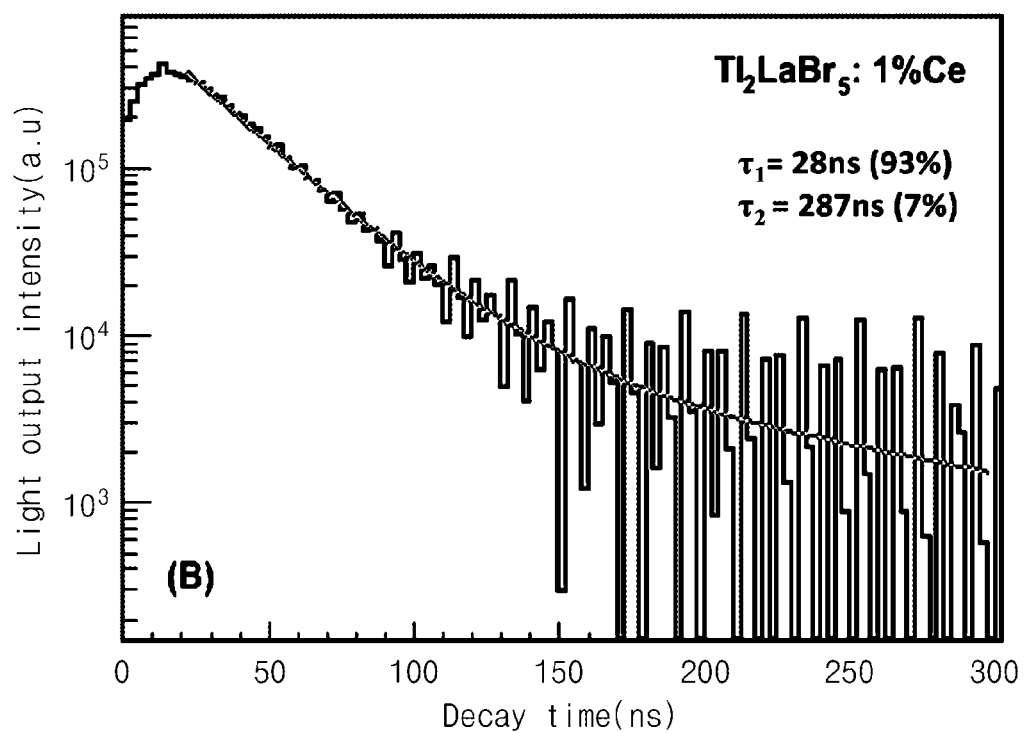
Figure 7C:
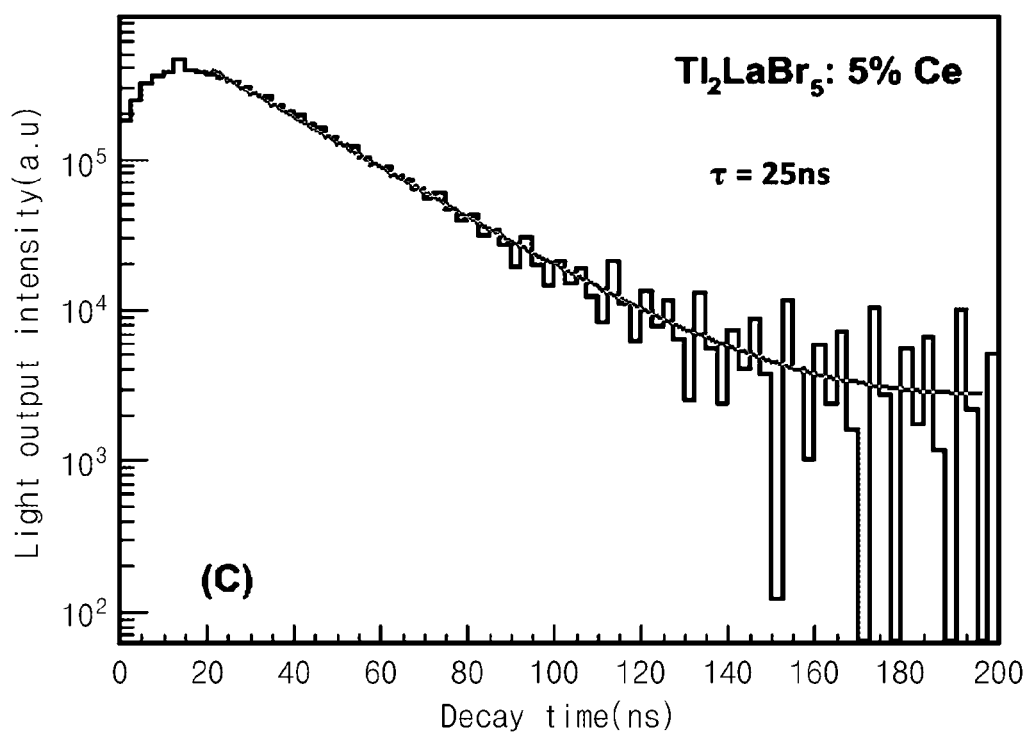

FIGS. 7A to 7C are graphs for evaluating a fluorescence decay time characteristic with respect to $^{137}$Cs 662 KeV γ-ray of a Tl$_2$LaBr$_5$:yCe scintillator according to an embodiment of the present invention. Referring to FIG. 7B, the fluorescence decay time of the Tl2LaBr5:1% Ce scintillator was configured from two time components, the fast time component was 28 ns and occupies most (approximately 93%) of the total fluorescence, and the slow time component is 287 ns and occupied approximately 7% of the total fluorescence. Referring to FIG. 7C, the Tl2LaBr5:Ce$_{0.05}$ scintillator showed a single fluorescence decay time characteristic, and showed a very fast fluorescence decay time. In particular, the scintillation sensor for positron tomography imaging apparatus (PET) should simultaneously measure two γ-rays generated by pair annihilation of positrons, and therefore, a fast time characteristic is very important. The present invention is determined to be very appropriate for the positron emission tomography imaging.

Figure 8:
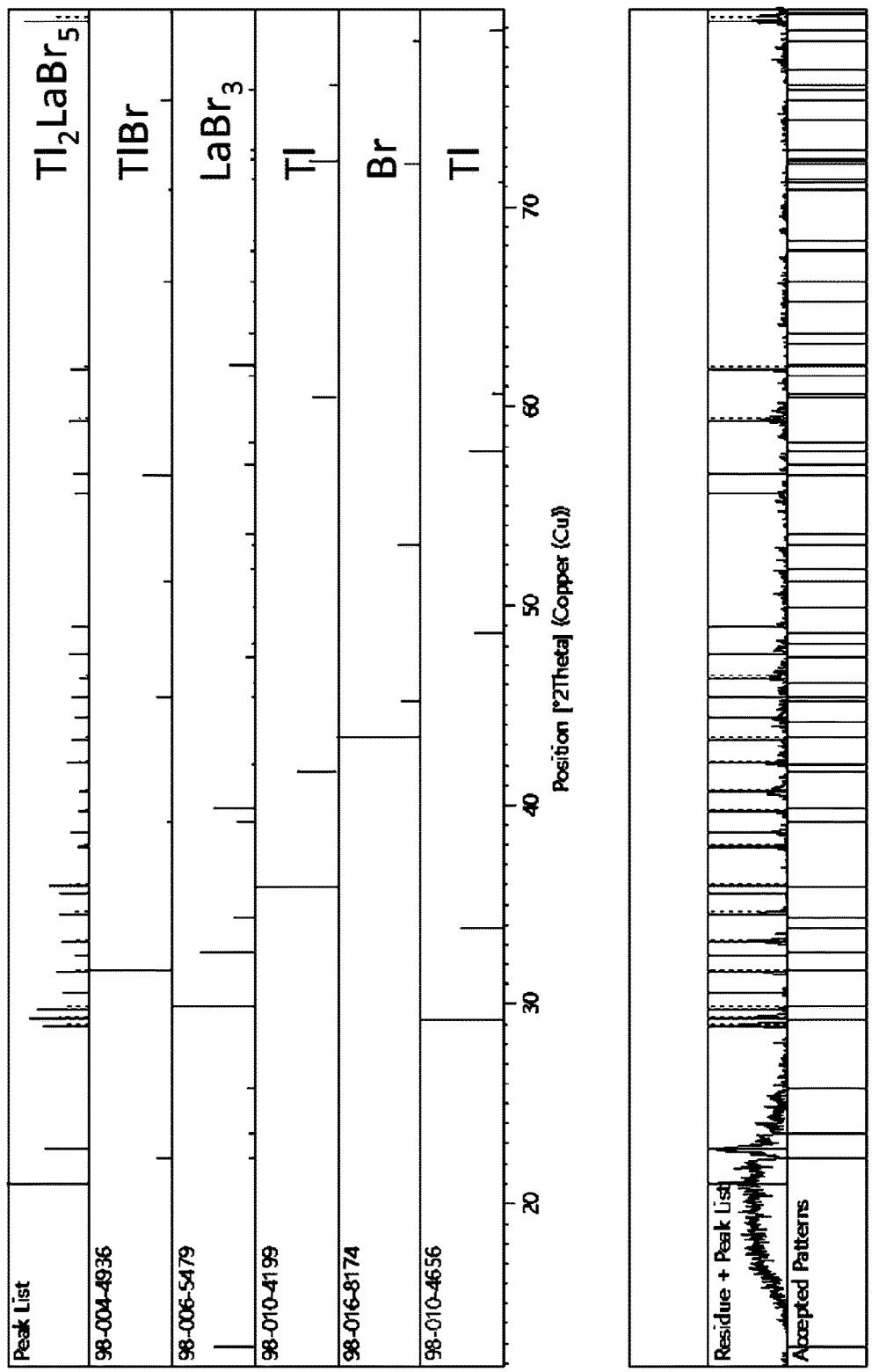
FIG. 8 is a result of an X-ray diffraction analysis of a $Tl_2LaBr_5$ scintillator according to an embodiment of the present invention.

FIG. 8 is a result of an X-ray diffraction analysis of a Tl$_2$LaBr$_5$ scintillator according to an embodiment of the present invention. It was confirmed that the Tl$_2$LaBr$_5$ scintillator according to an embodiment of the present invention be a material having a novel crystal structure which is not present in an existing crystal database. As a result of analyzing the pulse height spectrum of a scintillator according to an embodiment of the present invention against $^{137}$Cs 662 KeV γ-ray, the measured total light yield was a high value of approximately 26,000 phs/MeV.

The scintillator according to an embodiment of the present invention uses thallium as a matrix material, and since thallium has a very high atomic number of 81, the scintillator has a very high efficiency of detecting radiations, such as X-ray, γ-ray, ultraviolet ray, α-ray and β-ray, and may thus greatly reduce exposure dose to the human body when used in medical fields. In addition, easy growth of single crystals allows reduced manufacturing costs, and a short fluorescence decay time allows applications in a field such as positron emission tomography imaging apparatus requiring a fast time characteristic.

In addition, the scintillator according to an embodiment of the present invention has merits of having not only a light-emitting wavelength range well matched to the quantum efficiency characteristics of a photomultiplier tube, but also a fast fluorescence decay time and a large light yield, and thus, the scintillator may be used for computed tomography (CT), positron emission tomography (PET), γ-camera, single photon emission computer tomography (SPECT), or an Anger camera which capture a radiological image. In particular, embodiments of the present invention have short fluorescence decay time and a great light yield, and are thus suitable for positron emission tomography imaging apparatus (PET). In addition, the present invention may also be used as a radiation sensor for measuring various kinds of radiations such as ultraviolet rays, electron beams, α-particles, and β-particles.

Exemplary embodiments have been described so far to help understand the present invention but should not be construed as limiting the scope of the present invention, and various embodiments modified therefrom should be understood to also belong to the scope of the present invention. The technical scope of the present invention should be determined according to the technical concept of claims, and it should be understood that the technical scope of the present invention is not limited to the literal disclosure itself set forth in claims but substantially has an influence up to the inventions in a category having equivalent technical values.

The invention claimed is:

1. A scintillator comprising:
a matrix material comprising thallium, lanthanum, and a halogen element; and
an activator doped to the matrix material.

2. The scintillator of claim 1, wherein the activator comprises cerium.

3. The scintillator of claim 2, wherein a formula thereof is $Tl_aLa_bX_c:yCe$, and in the formula: X is a halogen element; $a=1$, $b=2$, $c=7$, or $a=2$, $b=1$, $c=5$, or $a=3$, $b=1$, $c=6$; and $y>0$ and $y\leq0.5$.

4. The scintillator of claim 1, wherein the halogen element comprises at least one among Cl, Br and I.

5. The scintillator of claim 1 wherein the matrix material does not comprise an alkali element.

6. A scintillator comprising a matrix material doped with an activator, the matrix material comprising a thallium halide and a lanthanum halide,
wherein the matrix material comprises a material having a formula $Tl_aLa_bX_c$, and in the formula, X is a halogen element; and $a=1$, $b=2$, $c=7$, or $a=2$, $b=1$, $c=5$, or $a=3$, $b=1$, $c=6$.

7. The scintillator of claim 6, wherein the activator comprises a cerium halide.

8. A method for manufacturing a scintillator, the method comprising:
manufacturing a matrix material comprising thallium, lanthanum, and a halogen element; and
doping the matrix material with an activator.

9. The method for manufacturing a scintillator of claim 8, wherein the manufacturing of the matrix material comprises adding a thallium halide and a lanthanum halide in a molar ratio of 1:2, 2:1, or 3:1.

10. The method for manufacturing a scintillator of claim 8, wherein the doping of the activator comprises doping the matrix material with a cerium halide.

11. The method for manufacturing a scintillator of claim 8, wherein the halogen element comprises at least one among Cl, Br and I.

12. The method for manufacturing a scintillator of claim 8, further comprising growing a mixture of the matrix material and the activator into a single crystal, wherein
the growing the mixture into the single crystal comprises descending an ampoule in which the mixture is sealed in a Bridgman electric furnace while heating the ampoule, wherein in the growing the mixture into the single crystal:
the crystal is grown while the ampoule is lowered in the Bridgman electric furnace at a crystal growing part;
a product of a descent speed of the ampoule in the Bridgman electric furnace and a temperature gradient at the crystal growing part in the Bridgman electric furnace is set to a range of 0.2-0.3° C./hr; and
the temperature gradient at the crystal growing part is a rate of an amount of a temperature change with respect to a positional change at a crystal growing position in the Bridgman electric furnace.

13. The method for manufacturing a scintillator of claim 12, wherein in the growing the mixture of the matrix material and the activator into the single crystal, a melting temperature of the mixture is 450-650° C.

* * * * *